United States Patent
Seefeldt et al.

(10) Patent No.: US 8,521,314 B2
(45) Date of Patent: Aug. 27, 2013

(54) HIERARCHICAL CONTROL PATH WITH CONSTRAINTS FOR AUDIO DYNAMICS PROCESSING

(75) Inventors: Alan Jeffrey Seefeldt, San Francisco, CA (US); Kenneth James Gundry, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 529 days.

(21) Appl. No.: 12/446,395

(22) PCT Filed: Oct. 16, 2007

(86) PCT No.: PCT/US2007/022132
§ 371 (c)(1),
(2), (4) Date: Sep. 13, 2010

(87) PCT Pub. No.: WO2008/057173
PCT Pub. Date: May 15, 2008

(65) Prior Publication Data
US 2011/0009987 A1  Jan. 13, 2011

Related U.S. Application Data

(60) Provisional application No. 60/856,586, filed on Nov. 1, 2006.

(51) Int. Cl.
*G06F 17/00* (2006.01)
(52) U.S. Cl.
USPC ............. 700/94; 381/104; 381/105; 381/106; 381/107; 381/108; 381/109; 704/500; 704/501; 704/502; 704/503; 704/504

(58) Field of Classification Search
USPC .......................................... 700/94
See application file for complete search history.

(56) References Cited

U.S. PATENT DOCUMENTS

| | | | |
|---|---|---|---|
| 2,808,475 A | 10/1957 | Stryker | |
| 4,249,042 A * | 2/1981 | Orban | ............... 381/106 |
| 4,281,218 A | 7/1981 | Chuang et al. | |
| 4,460,871 A | 7/1984 | Orban | |

(Continued)

FOREIGN PATENT DOCUMENTS

| | | |
|---|---|---|
| DE | 43 35 739 | 5/1995 |
| DE | 198 48 491 | 4/2000 |

(Continued)

OTHER PUBLICATIONS

MP4 specification: The MPEG 4 Book: Pereira, Ebrahimi; Copyright 2002.*

(Continued)

*Primary Examiner* — Paul McCord

(57) ABSTRACT

Information useful for modifying the dynamics of an audio signal is derived from one or more devices or processes operating at one or more respective nodes of each of a plurality of hierarchy levels, each hierarchical level having one or more nodes, in which the one or more devices or processes operating at each hierarchical level takes a measure of one or more characteristics of the audio signal such that the one or more devices or processes operating at each successively lower hierarchical level takes a measure of one or more characteristics of progressively smaller subdivisions of the audio signal.

6 Claims, 7 Drawing Sheets

(56) References Cited

U.S. PATENT DOCUMENTS

| | | | |
|---|---|---|---|
| 4,543,537 A | 9/1985 | Kuhn et al. |
| 4,739,514 A | 4/1988 | Short et al. |
| 4,843,626 A | 6/1989 | Werrbach |
| 4,887,299 A | 12/1989 | Cummins et al. |
| 4,922,535 A | 5/1990 | Dolby |
| 5,027,410 A | 6/1991 | Williamson et al. |
| 5,097,510 A | 3/1992 | Graupe |
| 5,172,358 A | 12/1992 | Kimura |
| 5,278,912 A * | 1/1994 | Waldhauer ............... 381/320 |
| 5,363,147 A | 11/1994 | Joseph et al. |
| 5,369,711 A | 11/1994 | Williamson, III |
| 5,377,277 A | 12/1994 | Bisping |
| RE34,961 E | 6/1995 | Widin et al. |
| 5,457,769 A | 10/1995 | Valley |
| 5,485,524 A * | 1/1996 | Kuusama et al. .......... 381/94.3 |
| 5,500,902 A | 3/1996 | Stockham, Jr. et al. |
| 5,530,760 A | 6/1996 | Paisley |
| 5,548,638 A | 8/1996 | Yamaguchi et al. |
| 5,583,962 A | 12/1996 | Davis et al. |
| 5,615,270 A | 3/1997 | Miller et al. |
| 5,632,005 A | 5/1997 | Davis et al. |
| 5,633,981 A | 5/1997 | Davis |
| 5,649,060 A | 7/1997 | Ellozy et al. |
| 5,663,727 A | 9/1997 | Vokac |
| 5,682,463 A | 10/1997 | Allen |
| 5,712,954 A | 1/1998 | Dezonno |
| 5,724,433 A | 3/1998 | Engebretson et al. |
| 5,727,119 A | 3/1998 | Davidson et al. |
| 5,737,434 A | 4/1998 | Orban |
| 5,784,476 A | 7/1998 | Bird |
| 5,819,247 A | 10/1998 | Freund et al. |
| 5,848,171 A | 12/1998 | Stockham, Jr. et al. |
| 5,862,228 A | 1/1999 | Davis |
| 5,878,391 A | 3/1999 | Aarts |
| 5,907,622 A | 5/1999 | Dougherty |
| 5,909,664 A | 6/1999 | Davis et al. |
| 6,002,776 A | 12/1999 | Bhadkamkar et al. |
| 6,002,966 A | 12/1999 | Loeb et al. |
| 6,021,386 A | 2/2000 | Davis et al. |
| 6,041,295 A | 3/2000 | Hinderks |
| 6,061,647 A | 5/2000 | Barrett |
| 6,088,461 A | 7/2000 | Lin et al. |
| 6,094,489 A | 7/2000 | Ishige et al. |
| 6,108,431 A | 8/2000 | Bachler |
| 6,125,343 A | 9/2000 | Schuster |
| 6,148,085 A | 11/2000 | Jung |
| 6,182,033 B1 | 1/2001 | Accardi et al. |
| 6,185,309 B1 | 2/2001 | Attias |
| 6,233,554 B1 | 5/2001 | Heimbigner et al. |
| 6,240,388 B1 | 5/2001 | Fukuchi |
| 6,263,371 B1 | 7/2001 | Geagan, III et al. |
| 6,272,360 B1 | 8/2001 | Yamaguchi et al. |
| 6,275,795 B1 | 8/2001 | Tzirkel-Hancock et al. |
| 6,298,139 B1 | 10/2001 | Poulsen et al. |
| 6,301,555 B2 | 10/2001 | Hinderks |
| 6,301,558 B1 * | 10/2001 | Isozaki .................. 704/228 |
| 6,311,155 B1 | 10/2001 | Vaudrey et al. |
| 6,314,396 B1 | 11/2001 | Monkowski |
| 6,327,366 B1 | 12/2001 | Uvacek et al. |
| 6,332,119 B1 | 12/2001 | Hinderks |
| 6,351,731 B1 | 2/2002 | Anderson et al. |
| 6,351,733 B1 | 2/2002 | Saunders et al. |
| 6,353,671 B1 | 3/2002 | Kandel et al. |
| 6,370,255 B1 | 4/2002 | Schaub et al. |
| 6,411,927 B1 | 6/2002 | Morin et al. |
| 6,430,533 B1 | 8/2002 | Kolluru et al. |
| 6,442,278 B1 | 8/2002 | Vaudrey et al. |
| 6,442,281 B2 | 8/2002 | Sato et al. |
| 6,473,731 B2 | 10/2002 | Hinderks |
| 6,498,855 B1 | 12/2002 | Kokkosoulis et al. |
| 6,529,605 B1 | 3/2003 | Christoph |
| 6,570,991 B1 | 5/2003 | Scheirer |
| 6,625,433 B1 | 9/2003 | Poirier et al. |
| 6,639,989 B1 | 10/2003 | Zacharov et al. |
| 6,650,755 B2 | 11/2003 | Vaudrey et al. |
| 6,651,041 B1 | 11/2003 | Juric |
| 6,700,982 B1 | 3/2004 | Geurts et al. |
| 6,807,525 B1 | 10/2004 | Li et al. |
| 6,823,303 B1 | 11/2004 | Su et al. |
| 6,873,709 B2 | 3/2005 | Hou |
| 6,889,186 B1 | 5/2005 | Michaelis |
| 6,985,594 B1 | 1/2006 | Vaudrey et al. |
| 7,065,498 B1 | 6/2006 | Thomas et al. |
| 7,068,723 B2 | 6/2006 | Foote et al. |
| 7,155,385 B2 | 12/2006 | Berestesky et al. |
| 7,171,272 B2 | 1/2007 | Blarney et al. |
| 7,181,034 B2 * | 2/2007 | Armstrong ................ 381/321 |
| 7,212,640 B2 | 5/2007 | Bizjak |
| 7,430,454 B2 * | 9/2008 | Ota et al. ............... 700/94 |
| 7,454,331 B2 | 11/2008 | Vinton |
| 7,787,640 B2 * | 8/2010 | Turicchia et al. ........... 381/98 |
| 7,805,314 B2 * | 9/2010 | Sung et al. .............. 704/501 |
| 7,865,256 B2 * | 1/2011 | Suzuki ................... 700/94 |
| 2001/0027393 A1 | 10/2001 | Touimi et al. |
| 2001/0038643 A1 | 11/2001 | McParland |
| 2002/0013698 A1 | 1/2002 | Vaudrey et al. |
| 2002/0040295 A1 | 4/2002 | Saunders et al. |
| 2002/0076072 A1 | 6/2002 | Cornelisse |
| 2002/0097882 A1 | 7/2002 | Greenberg et al. |
| 2002/0111704 A1 * | 8/2002 | Suzuki ................... 700/94 |
| 2002/0146137 A1 | 10/2002 | Kuhnel et al. |
| 2002/0147595 A1 | 10/2002 | Baumgarte |
| 2003/0002683 A1 | 1/2003 | Vaudrey et al. |
| 2003/0035549 A1 | 2/2003 | Bizjak et al. |
| 2004/0024591 A1 | 2/2004 | Boillot et al. |
| 2004/0037421 A1 | 2/2004 | Truman |
| 2004/0042617 A1 | 3/2004 | Beerends et al. |
| 2004/0044525 A1 | 3/2004 | Vinton et al. |
| 2004/0076302 A1 | 4/2004 | Christoph |
| 2004/0122662 A1 | 6/2004 | Crockett |
| 2004/0148159 A1 | 7/2004 | Crockett et al. |
| 2004/0165730 A1 | 8/2004 | Crockett |
| 2004/0172240 A1 | 9/2004 | Crockett et al. |
| 2004/0184537 A1 | 9/2004 | Geiger et al. |
| 2004/0190740 A1 | 9/2004 | Chalupper et al. |
| 2004/0213420 A1 * | 10/2004 | Gundry et al. ............. 381/104 |
| 2005/0240414 A1 * | 10/2005 | Tominaga ................ 704/500 |
| 2006/0002572 A1 | 1/2006 | Smithers et al. |
| 2006/0078208 A1 * | 4/2006 | Malvar ................... 382/232 |
| 2006/0148435 A1 * | 7/2006 | Romesburg et al. ....... 455/199.1 |
| 2006/0215852 A1 | 9/2006 | Troxel |
| 2007/0160231 A1 * | 7/2007 | Akiyama et al. ............ 381/98 |
| 2007/0269063 A1 * | 11/2007 | Goodwin et al. ........... 381/310 |
| 2007/0291959 A1 | 12/2007 | Seefeldt |

FOREIGN PATENT DOCUMENTS

| | | |
|---|---|---|
| EP | 0 517 233 | 12/1992 |
| EP | 0 637 011 | 2/1995 |
| EP | 0 661 905 | 5/1995 |
| EP | 0 746 116 | 12/1996 |
| EP | 1 239 269 | 9/2002 |
| EP | 1 251 715 | 10/2002 |
| EP | 1 251 715 A2 | 10/2002 |
| EP | 1 387 487 | 4/2004 |
| EP | 1 736 966 | 7/2007 |
| FR | 2 820 573 | 8/2002 |
| JP | 2003-158800 | 5/2003 |
| WO | WO/98/27543 | 6/1998 |
| WO | WO/00/78093 | 12/2000 |
| WO | WO/02/17678 | 2/2002 |
| WO | WO 03/090208 | 10/2003 |
| WO | WO 2004/019656 | 3/2004 |
| WO | WO 2004/073178 | 8/2004 |
| WO | WO 2004/111994 | 12/2004 |
| WO | WO 2005/086139 | 9/2005 |
| WO | WO 2005/104360 | 11/2005 |
| WO | WO 2006/006977 | 1/2006 |
| WO | WO 2006/019719 | 2/2006 |
| WO | WO 2006/047600 | 5/2006 |
| WO | WO 2006/113047 | 10/2006 |
| WO | WO/2007/120452 | 10/2007 |
| WO | WO/2007/120453 | 10/2007 |
| WO | WO 2007/123608 | 11/2007 |
| WO | WO/2007/127023 | 11/2007 |

| | | |
|---|---|---|
| WO | WO 2008/051347 | 5/2008 |
| WO | WO 2008/057173 | 5/2008 |
| WO | WO 2008/057173 A1 | 5/2008 |
| WO | WO/2008/085330 | 7/2008 |
| WO | WO 2008/115445 | 9/2008 |
| WO | WO 2008/156774 | 12/2008 |

OTHER PUBLICATIONS

Yamaha DME designer manual: Copyright 2004.*
Studer 820 Manual: Copyright 1991; see Chapter 4.*
SSL 9000 j Manual; Copyright 1994: see Chapters 2, 5.*
Australian Government IP Australia, Examiner's first report on patent application No. 2005299410, mailed Jun. 25, 2009, Australian Patent Appln. No. 2005299410.
Israel Patent Office, Examiner's Report on Israel Application No. 182097 mailed Apr. 11, 2010, Israel Patent Appln. No. 182097.
Intellectual Property Corporation of Malaysia, Substantive/Modified Substantive Examination Adverse Report (Section 30(1)/30(2)) and Search Report, dated Dec. 5, 2008, Malaysian Patent Appln. No. PI 20055232.
Dept of Justice & Human Rights of Republic of Indonesia, Directorate General Intellectual Property Rights, First Office Action, Indonesian Patent Appln. No. WO0200701285.
State Intellectual Property Office of the People's Republic of China, Notification of the Third Office Action, mailed Apr. 21, 2010, China Patent Appln. No. 200580036760.7.
European Patent Office Searching Authority, Int'l Search Report and Written Opinion, Int'l Appln. No. PCT/US2004/016964, mailed Jun. 20, 2005.
Translated Specification, ROC Patent Application No. 96139833, Dolby Laboratories Licensing Corporation, Oct. 24, 2007.
EP Patent Application No. 07 861 425.2-2225, Response to Communication pursuant to Rules 161 and 162 EPC dated Sep. 17, 2008.
Seefeldt, et al.; "A New Objective Measure of Perceived Loudness," Audio Engineering Society (AES) 117$^{th}$ Convention, Paper 6236, Oct. 28-31, 2004, San Francisco, CA, pp. 1-8.
Chalupper, Josef; "Aural Exciter and Loudness Maximizer: What's Psychoacoustic about Psychoacoustic Processors?," Audio Engineering Society (AES) 108$^{th}$ Convention, Sep. 22-25, 2000, Los Angeles, CA, pp. 1-20.
Claro Digital Perception Processing; "Sound Processing with a Human Perspective," pp. 1-8.
Masciale, John M.; "The Difficulties in Evaluating A-Weighted Sound Level Measurements," S&V Observer, pp. -2-3.
Ghent, Jr., et al.; "Expansion as a Sound Processing Tool in Hearing Aids," American Academy of Audiology National Convention, Apr. 29-May 2, 1999, Miami Beach, FL.
Ghent, Jr., et al.; "Uses of Expansion to Promote Listening Comfort with Hearing Aids," American Academy of Audiology 12$^{th}$ Annual Convention, Mar. 16-19, 2000, Chicago, IL.
Martinez G., Isaac; "Automatic Gain Control (AGC) Circuits—Theory and Design," University of Toronto ECE1352 Analog Integrated Circuits 1, Term Paper, Fall 2001, pp. 1-25.
Park, et al.; "High Performance Digital Hearing Aid Processor with Psychoacoustic Loudness Correction," IEEE FAM P3.1 0-7803-3734-4/97, pp. 312-313.
Bray, et al.; "Optimized Target Matching: Demonstration of an Adaptive Nonlinear DSP System," Sonic Innovations vol. 1 No. 2 1998, pp. 1-4, presented at the American Academy of Audiology, Los Angeles, CA, Apr. 4, 1998.
Bray, et al.; "An "Optimized" Platform for DSP Hearing Aids," Sonic Innovations, vol. 1 No. 3 1998, pp. 1-4, presented at the Conference on Advanced Signal Processing Hearing Aids, Cleveland, OH, Aug. 1, 1998.
Bray, et al.; "Digital Signal Processing (DSP) Derived from a Nonlinear Auditory Model," Sonic Innovations, vol. 1 No. 1 1998, pp. 1-3, presented at American Academy of Audiology, Los Angeles, CA, Apr. 4, 1998.
Ghent, Jr., et al.; "Uses of Expansion to Promote Listening Comfort with Hearing Aids," Sonic Innovations, vol. 3 No. 2, 2000, pp. 1-4, presented at American Academy of Audiology 12$^{th}$ Annual Convention, Chicago, IL, Mar. 16-19, 2000.

Nilsson, et al.: "The Evolution of Multi-channel Compression Hearing Aids," Sonic Innovations, Presented at American Academy of Audiology 13$^{th}$ Convention, San Diego, CA, Apr. 19-22, 2001.
Johns, et al.; "An Advanced Graphic Equalizer Hearing Aid: Going Beyond Your Home Audio System," Sonic Innovations Corporation, Mar. 5, 2001, Http://www.audiologyonline.com/articles/pf_arc_disp.asp?id=279.
Smith, et al., "Tandem-Free VoIP Conferencing: A Bridge to Next-Generation Networks," IEEE Communications Magazine, IEEE Service Center, New York, NY, vol. 41, No. 5, May 2003, pp. 136-145.
H. H. Scott, "The Amplifier and Its Place in the High Fidelity System," J. Audio Eng. Soc., vol. 1, No. 3, Jul. 1953.
Nigro, et al., "Concert-Hall Realism through the Use of Dynamic Level Control," J. Audio Eng. Soc., vol. 1, No. 1, Jan. 1953.
Newcomb, et al., "Practical Loudness: an Active Circuit Design Approach," J. Audio eng. Soc., vol. 24, No. 1, Jan./Feb. 1976.
Robinson, et a., Dynamic Range Control via Metadata, 107$^{th}$ Convention of the AES, Sep. 14-27, 1999, New York.
Watson, et al., "Signal Duration and Signal Frequency in Relation to Auditory Sensitivity," Journal of the Acoustical Society of America, vol. 46, No. 4 (Part 2) 1969, pp. 989-997.
ATSC Standard A52/A: Digital Audio Compression Standard (AC-3), Revision A, Advanced Television Systems Committee, Aug. 20, 2001. The A/52A document is available on the World Wide Web at http://www./atsc.org._standards.html.
Todd, et al., "Flexible Perceptual Coding for Audio Transmission and Storage," 96$^{th}$ Convention of the Audio Engineering Society, Feb. 26, 1994, Preprint, 3796.
Davis, Mark, "The AC-3 Multichannel Coder," Audio engineering Society, Preprint 3774, 95$^{th}$ AES Convention, Oct. 1993.
Bosi, et al., "High Quality, Low-Rate Audio Transform Coding for Transmission and Multimedia Applications," Audio Engineering Society Preprint 3365, 93$^{rd}$ AES Convention, Oct. 1992.
Fielder, et al., "Introduction to Dolby Digital Plus, an Enhancement to the Dolby Digital Coding System," AES Convention Paper 6196, 117$^{th}$ AES Convention, Oct. 28, 2004.
Truman, et al., "Efficient Bit Allocation, Quantization, and Coding in an Audio Distribution System," AES Preprint 5068, 107$^{th}$ AES Conference, Aug. 1999.
Fielder, et al., "Professional Audio Coder Optimized fro Use with Video," AES Preprint 5033, 107$^{th}$ AES Conference, Aug. 1999.
Brandenburg, et al., "Overview of MPEG Audio: Current and Future Standards for Low-Bit-Rate Audio Coding," J. Audio eng. Soc., vol. 45, No. 1/2, Jan./Feb. 1997.
Vernon, Steve, "Design and Implementation of AC-3 Coders," IEEE Trans. Consumer Electronics, vol. 41, No. 3, Aug. 1995.
Crockett, et al., "A Method for Characterizing and Identifying Audio Based on Auditory Scene Analysis," Audio Engineering Society Convention Paper 6416, 118$^{th}$ Convention, Barcelona, May 28-31, 2005.
Crockett, Brett, "High Quality Multichannel Time Scaling and Pitch-Shifting using Auditory Scene Analysis," Audio Engineering Society Convention Paper 5948, New York, Oct. 2003.
Hauenstein M., "A Computationally Efficient Algorithm for Calculating Loudness Patterns of Narrowband Speech," Acoustics, Speech and Signal Processing 1997. 1997 IEEE International Conference, Munich Germany, Apr. 21-24, 1997, Los Alamitos, Ca, USA, IEEE Comput. Soc., US, Apr. 21, 1997, pp. 1311-1314.
Cheng-Chieh Lee, "Diversity Control Among Multiple Coders: A Simple Approach to Multiple Descriptions," IEE, September.
Moore, et al., "A Model for the Prediction of Thresholds, Loudness and Partial Loudness," Journal of the Audio Engineering Society, Audio Engineering Society, New York, vol. 45, No. 4, Apr. 1997, pp. 224-240.
Glasberg, et al., "A Model of Loudness Applicable to Time-Varying Sounds," Journal of the Audio Engineering Society, Audio Engineering Society, New York, vol. 50, No. 5, May 2002, pp. 331-342.
Stevens, "Calculations of the Loudness of Complex Noise," Journal of the Acoustical Society of America, 1956.
Zwicker, "Psychological and Methodical Basis of Loudness," Acoustica, 1958.
Australian Broadcasting Authority (ABA), "Investigation into Loudness of Advertisements," Jul. 2002.

Zwicker, et al., "Psychoacoustics—Facts and Models," Springer-Verlag, Chapter 8, "Loudness," pp. 203-238, Berlin Heidelberg, 1990, 1999.

Lin, L., et al., "Auditory Filter Bank Design Using Masking Curves," 7th European Conference on Speech Communications and Technology, Sep. 2001.

ISO226 : 1987 (E), "Acoustics—Normal Equal Loudness Level Contours.".

Seo, et al., "Auditory Model Design for Objective Audio Quality Measurement," Department of Electronic Engineering, Dongguk University, Seoul Korea.

Moulton, Dave, "Loud, Louder, Loudest!," Electronic Musician, Aug. 1, 2003.

Riedmiller, Jeff, "Working Toward Consistency in Program Loudness," Broadcast Engineering, Jan. 1, 2004.

Robinson, et al., "Time-Domain Auditory Model for the Assessment of High-Quality Coded Audio," 107th AES Convention, Sep. 1999.

Hermesand, et al., "Sound Design—Creating the Sound for Complex Systems and Virtual Objects," Chapter II, "Anatomy and Psychoacoustics," 2003-2004.

Notification of Transmittal of the International Search Report, PCT/US2006/011202, dated Aug. 9, 2006.

Written Opinion of the International Search Authority, PCT/US2006/011202, dated Aug. 9, 2006.

Carroll, Tim, "Audio Metadata: You can get there from here", Oct. 11, 2004, pp. 1-4, XP002392570. http://tvtechnology.com/features/audio_notes/f-TC-metadata-08.21.02.shtml.

Trapee, W., et al., "Key distribution for secure multimedia multicasts via data embedding," 2001 IEEE International Conferenced on Acoustics, Speech, and Signal Processing. May 7-11, 2001.

Bertsekas, Dimitri P., "Nonlinear Progamming," 1995, Chapter 1.2 "Gradient Methods—Convergence," pp. 18-46.

Bertsekas, Dimitri P., "Nonlinear Programming," 1995, Chapter 1.8 "Nonderivative Methods,", pp. 142-148.

Moore, BCJ, "Use of a loudness model for hearing aid fitting, IV. Fitting hearing aids with multi-channel compression so as to restore "normal" loudness for speech at different levels." British Journal of Audiology, vol. 34, No. 3, pp. 165-177, Jun. 2000, Whurr Publishers, UK.

Saunders, "Real-Time Discrimination of Broadcast Speech/Music," Proc. of Int. Conf. on Acoust. Speech and Sig. Proce., 1996, pp. 993-996.

Bosi, et al., "ISO/IEC MPEG-2 Advanced Audio coding," J. Audio Eng. Soc., vol. 45, No. 10, Oct. 1997, pp. 789-814.

Scheirer and Slaney, "Construction and Evaluation of a robust Multifeature Speech/Music Discriminator," Proc. of Int. Conf. on Acoust. Speech and Sig. Proc., 1997, pp. 1331-1334.

Schapire, "A Brief Introduction to Boosting," Proc. of the 16th Int. Joint Conference on Artificial Intelligence, 1999.

Guide to the Use of the ATSC Digital Television Standard, Dec. 4, 2003.

ISO Standard 532:1975, published 1975.

Belger, "The Loudness Balance of Audio Broadcast Programs," J. Audio Eng. Soc., vol. 17, No. 3, Jun. 1969, pp. 282-285.

Atkinson, I. A., et al., "Time Envelope LP Vocoder: A New Coding Technology at Very Low Bit Rates," 4th ed., 1995, ISSN 1018-4074, pp. 241-244.

Mapes, Riordan, et al., "Towards a model of Loudness Recalibration," 1997 IEEE ASSP workshop on New Paltz, NY USA, Oct. 19-22, 1997.

CEI/IEC Standard 60804 published Oct. 2000.

Blesser, Barry, "An Ultraminiature console Compression System with Maximum User Flexibility," Journal of Audio Engineering Society, vol. 20, No. 4, May 1972, pp. 297-302.

Hoeg, W., et al., "Dynamic Range Control (DRC) and Music/Speech Control (MSC) Programme-Associated Data Services for DAB", EBU Review-Technical, European Broadcasting Union, Brussels, BE, No. 261, Sep. 21, 1994.

Soulodre, GA, "Evaluation of Objective Loudness Meters" Preprints of Papers Presented at the 116th AES Convention, Berlin, Germany, May 8, 2004.

Notification of Transmittal of the International Search Report, PCT/US2007/08313), dated Sep. 21, 2007.

The Written Opinion of the International Searching Authority, PCT/US2007/08313), dated Sep. 21, 2007.

Notification of Transmittal of the International Search Report, PCT/US2007/007946, dated Aug. 21, 2007.

The Written Opinion of the International Searching Authority, PCT/US2007/007946, dated Aug. 21, 2007.

Notification of Transmittal of the International Search Report, PCT/US2007/007945, dated Aug. 17, 2007.

The Written Opinion of the International Searching Authority, PCT/US2007/007945, dated Aug. 17, 2007.

Notification of Transmittal of the International Search Report, PCT/US2007/0025747, dated Apr. 14, 2008.

The Written Opinion of the International Searching Authority, PCT/US2007/0025747, dated Apr. 14, 2008.

International Search Report, PCT/US2004/016964 dated Dec. 1, 2005.

Written Opinion of the International Searching Authority, PCT/US2004/016964 dated Dec. 1, 2005.

International Search Report, PCT/US2006/010823 dated Jul. 25, 2006.

Written Opinion of the International Searching Authority, PCT/US2006/010823 dated Jul. 25, 2006.

International Search Report, PCT/US2005/038579 dated Feb. 21, 2006.

Written Opinion of the International Searching Authority, PCT/US2005/038579 dated Feb. 21, 2006.

International Search Report, PCT/US2007/022132 dated Apr. 18, 2008.

Written Opinion of the International Searching Authority, PCT/US2007/022132 dated Apr. 18, 2008.

International Search Report, PCT/US2007/006444 dated Aug. 28, 2007.

Written Opinion of the International Searching Authority, PCT/US2007/006444 dated Aug. 28, 2007.

Notification of Transmittal of the International Search Report, PCT/US2008/007570, dated Sep. 10, 2008.

The Written Opinion of the International Searching Authority, PCT/US2008/007570, dated Sep. 10, 2008.

International Search Report, PCT/US2007/020747, dated May 21, 2008.

Mexican Patent Application No. PA/a/2005/002290—Response to Office Action dated Oct. 5, 2007.

Communication Under Rule 51(4) EPC, European Patent Office, EP Application No. 03791682.2-2218, dated Dec. 5, 2005.

Notification of the First Office Action, Chinese Application No. 03819918.1, dated Mar. 30, 2007.

Response to Notification of the First Office Action, Chinese Application No. 03819918.1, dated Aug. 14, 2007.

Response Office Action from the Israel Patent Office, Israel Patent Application No. 165,398, dated Dec. 29, 2008.

Official Letter from the Intellectual Property Bureau, Ministry of Economic Affairs, Taiwan, dated Mar. 21, 2008.

Response to Official Letter from the Intellectual Property Bureau, Ministry of Economic Affairs, Taiwan, dated Jun. 25, 2008.

Written Opinion of the Intellectual Property Office of Singapore, Singapore Application No. 0702926-7, dated May 12, 2008.

European Patent Office, Office Action dated Apr. 2, 2008, EP Application No. 05818505.9.

European Patent Office, Response to Office Action dated Apr. 2, 2008, EP Application No. 05818505.9.

* cited by examiner

HIERARCHICAL CONTROL PATH WITH CONSTRAINTS FOR AUDIO DYNAMICS PROCESSING

TECHNICAL FIELD

The invention relates to audio signal processors, audio signal processing, and software for controlling audio signal processors and audio signal processing. In accordance with aspects of the invention, a hierarchical control path for dynamics processing is provided and constraints on audio signal dynamics processing are imposed in a hierarchical manner to provide improved performance.

BACKGROUND ART

The object of audio dynamics processing is to alter the relative level or dynamics of an audio signal to be within some desired limits. This is generally achieved by creating some type of time-varying measure of an audio signal's level (rms level or peak level, for example) and then computing and applying a signal modification (a gain change, for example) that is a function of the level measure. Dynamics processors sharing such a mode of operation are set forth in International Patent Application PCT/US 2005/038579 of Alan Jeffrey Seefeldt, published as WO 2006/047600 on May 4, 2006 and include automatic gain controls (AGCs), dynamic range controls (DRCs), expanders, limiters, noise gates, etc. The Seefeldt application designates the United States among other entities. The application is hereby incorporated by reference in its entirety.

FIG. 1 depicts a high-level block diagram of a generic audio dynamics processor that processes an audio signal (a single channel of a multichannel audio signal or an audio signal having only one channel). The processor may be considered to have two paths: an upper "signal" path 2 and a lower "control" path 4. On the lower control path, the level of the audio signal is measured by a measuring device or process ("Level Measure") 6 and this measurement, a measure of the signal level, is then used by a dynamics control device or process ("Dynamics Control") 8 to compute one or more signal modification parameters. Such parameters function as signal modification control signals and are used to modify the audio signal according to a dynamics processing function, which function may be a desired dynamics processing profile such as shown in FIG. 3b, described below. As shown, the modification parameters are derived from the input audio signal. Alternatively, the modification parameters may be derived from the processed (output) audio or from a combination of the input and output audio signals. In the audio signal path 2, the modification parameters generated by the Dynamics Control 8 are applied to the audio to control the modification of the audio, thereby generating the processed audio. The application of the modification parameters to an audio signal may be accomplished in many known ways and is shown generically by the multiplier symbol 12. In the audio signal path 2, the audio may be delayed by a delay device or process ("Delay") 10 to compensate for any delay associated with the level estimation and dynamics control processes.

When dealing with complex multichannel audio material, care must be taken in computing and applying the signal modifications in order to avoid the introduction of perceptible artifacts. A basic dynamics processor receiving a multichannel audio signal input might compute a signal level that is representative of all channels combined in total and then apply the same modification to all channels based on such a total level measure. In modifying all channels in the same way, such an approach has the advantage of maintaining the relative levels among all channels, thereby preserving the spatial image (including, for example, the location of virtual images panned between channels as well as perceived diffuseness). Such an approach may work well if the applied modifications are not overly aggressive.

However, problems may arise when the desired modifications are more severe. Consider a multichannel audio signal (5.1 channels, for example) to which a dynamic range controller with a very high compression ratio is applied. With such a processor, signals above the compression threshold are attenuated significantly to bring the signal level closer to the threshold. Assume that the audio signal contains relatively constant-level background music in all channels for which the total level after combining all channels is below the compression threshold. Assume further that a brief but loud segment of dialog is introduced into the center channel. Due to the dialog, the total level of all channels combined now exceeds the compression threshold and the entire signal is therefore attenuated. Once the dialog is finished, the signal level falls back below the compression threshold and no attenuation is applied. As a result, the background music from the left, right, left surround, and right surround channels is heard to fluctuate in level or "pump" down and back up in accordance with the dialog in the center channel. The effect can be very unnatural sounding and disturbing for a listener. This type of artifact, a type of cross-modulation or intermodulation, is well recognized in the field of audio dynamics processing, and a typical prior art solution involves applying dynamic range control independently to each channel. Although such a solution may correct the aforementioned problem, it may have the disadvantage of altering the spatial image of the audio. In particular, virtual sources panned between two channels may appear to "wander" due to differing amounts of attenuation applied to the two channels. Thus, there is a need for a solution that addresses both the pumping and the unstable image problems.

Analogous problems exist when considering the spectrum of a single channel of audio. Consider a single channel that contains a sustained string note at mid to high frequencies for which the signal level is below the compression threshold. Now consider a very loud bass drum hit introduced at the low frequencies causing the signal level to momentarily increase above the compression threshold. The entire signal is momentarily attenuated resulting in the strings being perceived to pump unnaturally down and up in level in accordance with the bass drum. A typical prior art solution to this problem is to break the audio signal into multiple frequency bands and then apply dynamic range control independently to each band. This reduces the pumping problem, but may alter the perceived spectral balance or timbre. Thus, there is a need for a solution that reduces pumping while reducing changes in the perceived spectral balance.

DISCLOSURE OF THE INVENTION

In accordance with aspects of the present invention, information useful for modifying the dynamics of an audio signal is derived from one or more devices or processes operating at one or more respective nodes of each of a plurality of hierarchy levels, each hierarchical level having one or more nodes, in which the one or more devices or processes operating at each hierarchical level takes a measure of one or more characteristics of the audio signal such that the one or more devices or processes operating at each successively lower hierarchical level takes a measure of one or more characteristics of progressively smaller subdivisions of the audio signal. The information useful for modifying the dynamics of an audio signal may be applied to an audio signal in a device or process associated with the device or process that derives the information or such information may be carried along with the audio signal as metadata, for example, so that the information may be applied to the audio signal spatially and/or temporally remote. The progressively smaller subdivisions of the audio may include one or both of (1) channel subdivisions and (2) frequency band subdivisions. Said one or more devices or one or more processes at each node of each hierarchical level takes a measure of the audio at the node's hierarchical level and may derive information from such measure of the audio signal and also from information that it may receive from one or more devices or processes at another hierarchical level, as explained further below.

A first, topmost, level of the hierarchy may comprise a root node that takes a measure of a totality of the audio signal. In the case of a multichannel audio signal, at least one lower hierarchical level may comprise a plurality of nodes each taking a measure of a channel subdivision of the audio signal, and at least one further lower hierarchical level may comprise a plurality of nodes each taking a measure of a frequency subdivision of channels of the audio signal. In the case of a single channel audio signal, at least one lower hierarchical level may comprise a plurality of nodes each taking a measure of a frequency subdivision of the audio signal.

In accordance with further aspects of the present invention, information derived from a measure of the audio signal at a particular hierarchical level may be passed downward in the hierarchy to one or more lower hierarchical levels in order to influence the operation of the devices or processes operating at such hierarchical levels. Information derived from a measure of the audio information at a particular hierarchical level may comprise not only information useful for influencing the operation of devices and processes operating at one or more lower hierarchical levels but also information useful for modifying the dynamics of the audio signal.

In accordance with yet further aspects of the present invention, information derived from a measure of the audio signal at a particular lower hierarchical level and from information passed to such a lower hierarchical level may be used to influence the operation of the devices or processes operating at such a lower hierarchical level. Such influence may, for example, cause the lower hierarchical level to generate a modification of the information that it would otherwise generate. Alternatively, or in addition, information derived from a measure of the audio signal at a particular lower hierarchical level and also from information passed to such a lower hierarchical level may be passed upward in the hierarchy to one or more higher hierarchical levels in order to influence the operation of the devices or processes operating at such higher hierarchical levels. Such influence may, for example, cause a higher hierarchical level to generate a modification of the information that it would otherwise pass to one or more lower hierarchical levels or that would be used for modifying the audio signal.

FIG. 2a depicts a schematic overview of an example of hierarchical control path architecture according to aspects of the invention in which information is passed down a control path hierarchy from top to bottom (a "top-down" hierarchical arrangement). In this example of a top-down control path hierarchy, the input signal to the dynamics processor or process is a multiband audio signal and the hierarchical levels are (1) all bands of all channels (the "Total" hierarchical level), (2) channels within the multichannel audio signal (the "Channels" hierarchical level), and (3) frequency bands within each channel (the "Bands" hierarchical level). Outputs of respective Dynamics Control devices or processes at the Bands hierarchical level, at the right-hand side of the figure, may function as signal modification control signals and may be applied so as to modify the audio signals in the respective channels and bands of an audio signal being processed as shown in FIG. 2b, described below. Alternatively, such control signals may be carried along with the audio signal as metadata, for example, so that the information may be applied to the audio signal, in the manner of FIG. 2b, for example, at a spatially and/or temporally remote place. As is explained further below, the information passed down the hierarchy may include more than modification parameters suitable for controlling the modification of the audio signal if they were applied to it—the information passed down the hierarchy may, include control parameters usable within Dynamics Control devices or processes for influencing the operation of such devices or processes (such control parameters may be referred to as "dynamics control parameters" and such parameters may include "modification parameters" suitable for directly or indirectly controlling the audio signal).

The input signal applied to the FIG. 2a hierarchical control path may be derived from an audio signal applied to an audio dynamics processor of which the FIG. 2a control path is a part, or, alternatively, from the processed (output) audio of such an audio dynamics processor or from a combination of such input and output audio signals.

In FIG. 2a, the solid lines represent the flow of audio of a multichannel audio signal having channels $x_1, \ldots x_C$ and each channel having one of more frequency bands or "subbands" $b_1 \ldots b_n$. Although, in principle, aspects of the invention may be practiced by analog, digital or hybrid analog/digital embodiments, in practical embodiments, processing of the audio may be performed in the digital domain. The dashed line output of each Dynamics Control device or process represents one or more dynamics control parameters generated by a respective Dynamics Control device or process. Dynamics control parameters may be coupled to Dynamics Control devices or processes in lower hierarchical levels of the control path hierarchy for the purposes of imposing constraints. For example, as explained in connection with an example described below, values of long-term signal level, long-term gain and short-term gain may be passed down from the Total hierarchical level to the Channels hierarchical level and from the Channels hierarchical level to the Bands hierarchical level to implement constraints. Of these, only the short-term gain at the Bands hierarchical level applied to control the audio signal's dynamics in the examples described herein (and such short term-gain may be time-smoothed, also as in a described example).

In principle, information passed down the hierarchy may skip being applied to one or more hierarchical levels. Also, in principle, information from hierarchical levels other than the Bands hierarchical level may be applied (in addition to or in place of information from the Bands hierarchical level) to control the audio signal's dynamics. Such information may be time-smoothed.

Thus, in the FIG. 2a control path example, a multichannel audio signal having channels $x_1 \ldots x_C$ is applied to a first hierarchical control path level, the Total hierarchical level, in which a device or process ("Total Level Measure") 14 computes an average signal level measure for the total of all audio channels combined. The operation of Total Level 14 is similar to that of Level 6 of FIG. 1 except that Total Level 14 operates on all channels of a multichannel audio signal rather than on the single channel of a multichannel audio signal or an audio signal having only one channel. The measurement obtained by Total Level 14, a measure of the total signal level, may then be used by a dynamics control device or process ("Dynamics Control") 16, to compute one or more Total hierarchical level dynamics control parameters that may include one or more signal modification parameters. Some or all of the dynamics control parameters computed by Dynamic Control 16 may be passed down to Dynamics Controls 20 in the Channels hierarchical level for use by such Dynamics Controls in their operation. Modification parameters computed by the Total hierarchical level's Dynamics Control 16, or functions thereof, may be applied to the audio signal, but are not in this example.

Next, in a second hierarchical control path level, the Channels hierarchical level, the next lower hierarchical level in this example, each channel $x_1$ through $x_c$ is applied to its own pair of Level Measure and Dynamics Control devices or processes 18-1 through 18-*c* and 20-1 through 20-*c*, respectively. Each Level Measure 18-1 through 18-*c* may operate in a manner similar to Level Measure 6 of FIG. 1 to compute an average signal level measure for the particular audio channel that is applied to it. From that level measure each Dynamics Control 20-1 through 20-*c* in the Level/Dynamics-Control pair computes one or more dynamics control parameters that may include one or more signal modification parameters. However, in addition to differing from the FIG. 1 Dynamics Control 8 in producing dynamics control parameters rather than modification parameters, the Dynamics Controls 20-1 through 20-*c* in the FIG. 2*a* arrangement also differ in receiving one or more dynamics control parameters calculated by Dynamics Control 16 in the hierarchical step next above. Such higher hierarchical level dynamics control parameters may be used to constrain or affect the operation of the respective Dynamics Controls 20-1 through 20-*c*. Some or all of the dynamics control parameters computed by Dynamic Controls 20 may be passed down to Dynamics Controls 26 in the Bands hierarchical level for use by such Dynamics Controls in their operation. Modification parameters, or functions thereof, computed by one or more of Dynamics Controls 20 may be applied to the audio signal, but are not in this example.

Next in a third hierarchical control path level, the Bands hierarchical level, each channel $x_1$ through $x_c$ of the audio signal is applied to a band splitting device or function ("Band Split") 22-1 through 22-*c* that splits each audio channel into a plurality of frequency bands $b_1$ through $b_n$. Many devices and processes for splitting an audio signal into frequency bands are well known in the art (filterbanks, bandpass filters, quadrature mirror filters, time-to-frequency transforms, etc.). The use of any particular such band splitter is not critical to the invention. Each frequency band of each channel is applied to its own pair of Level Measure and Dynamics Control devices or processes 24-1-1 through 24-*c*-*n* and 26-1-1 through 26-*c*-*n*, respectively. Each Level Measure 24-1-1 through 24-*c*-*n* may operate in a manner similar to Level Measure 6 of FIG. 1 to compute an average signal level measure for the particular frequency band of the audio channel that is applied to it—thus, it operates at a frequency band hierarchical level rather than a channel hierarchical level. From the signal level measure provided by the Level Measure paired with it, each Dynamics Control 26-1-1 through 26-*c*-*n* computes signal modification parameters, in a manner similar to Dynamics Control 8 of FIG. 1. However, unlike the FIG. 1 Dynamics Control 8, the Dynamics Controls 26-1-1 through 26-*c*-*n* in the FIG. 2*a* example may also receive one or more dynamics control parameters calculated by Dynamics Control 20 associated with the same channel in the hierarchical step next above. Such higher hierarchical level modification parameters may be used to constrain or affect the operation of the respective Dynamics Controls 26-1-1 through 26-*c*-*n* operating on bands within a channel. One or more modification parameters calculated by each of Dynamics Controls 26-1-1 through 26-*c*-*n* may be applied to bands of each channel of the audio, as shown in FIG. 2*b*. At the Bands hierarchical level, because it is the bottom level of the hierarchy in this example, the Dynamics Controls 26 need not provide a dynamics control parameters output (none is required) but instead provide an output of one or more modification parameters that may be used to control modification of the audio signal as shown in FIG. 2*b*.

Referring to FIG. 2*b*, in a manner similar to the upper signal path of FIG. 1, a particular band of each channel of audio (audio channel 1 band 1 through audio channel c band n) is applied to a respective signal path having a respective delay 10-1-1 through 10-*c*-*n* and a respective multiplier 12-1-1 through 12-*c*-*n*. As in FIG. 1, the multipliers are shown generically by a multiplier symbol to indicate any suitable way of modifying the audio in response to one or more modification parameters. Each of the multipliers receives one or more modification parameters from a corresponding Dynamics Control 26-1-1 through 26-*c*-*n* (i.e., the channel 1 band 1 audio is modified by modification parameters from the Dynamics Control for channel 1 band 1, etc.). Alternatively, modification parameters or functions of them produced by other levels of the hierarchy may be applied to the audio signal, one or more of its channels, and/or one or more bands of one or more its channels.

Although the example of FIGS. 2*a* and 2*b* shows a three-level hierarchy of Total hierarchical level, Channels hierarchical level, and Bands hierarchical level, aspects of the invention are not limited to a three-level hierarchy and the hierarchy may be of a different order. For example, one may not wish to perform multi-band modifications, in which case a two-level hierarchy having only a total hierarchical level and a channel hierarchical level may be appropriate. Similarly, one might not want to allow any independence among channels and therefore may utilize a two-level hierarchy of only a total hierarchical level and a band hierarchical level. In other words, one may not want to apply different modification parameters to different channels—the bands may be treated differently, but each band may be modified in the same way across all channels. As mentioned above, each hierarchical level may comprise one or more devices or processes. The three-hierarchy example of FIGS. 2*a* and 6 may be expanded to include more hierarchical levels. For example, rather than splitting the signal into a plurality of bands at one level, one might split the signal into two bands at a first band level. Then each of these bands may be further split into two more bands at a second band-level, etc. Similarly, the splitting into channels may occur in more than one hierarchy level. For example, after the Total level, the channels might be split into three groups in a first channel hierarchy level: (1) Left and Right, (2) Center, and (3) Left Surround and Right Surround. Then, at the next channel hierarchy level the Left and Right group may be split explicitly into Left and Right. Similarly, the Left Surround and Right Surround group may be split explicitly into Left Surround and Right Surround.

A control path hierarchy having constraints in the manner of the example of FIGS. 2*a* and 2*b* and variations thereof is applicable to a wide variety of dynamics processing applications, such as compressors, limiter, expanders, etc. However, for simplicity in explanation, examples of aspects of the present invention are described in the context of dynamic range controls (DRCs) in which the original dynamic range of an audio signal is reduced. In other words, loud portions of the audio are made softer and/or quiet portions are made louder. Such processing is useful, for example, when one wishes to listen to a selection of audio late at night at a reduced average volume.

FIG. 3a depicts a typical input/output profile or transfer function for a DRC in which the horizontal axis is a logarithmic representation of the input signal level, and the vertical axis is a logarithmic representation of the desired output signal level. Signal level generically represents any of a number of possible measures; for example rms level or psychoacoustic loudness level, as will be described in a preferred embodiment. In the "null band" region of the profile or transfer function the slope of the curve is unity, indicating that no signal modification is made. Above and below the null band, the slope is less than one indicating that compression is applied—above the null band the audio is attenuated, and below the null band the audio is boosted. FIG. 3b depicts an equivalent representation of the FIG. 3a input/output profile or transfer function that replaces the output signal level on the vertical axis with the log of the gain, which when applied to the input signal level, results in the desired output signal level. In this context, the term "gain" is meant to represent generically a modification that either boosts or attenuates the signal. Such "gain" may be a value that is directly multiplied with the signal or it might be something more sophisticated, such as a scaling of perceptual loudness, as will be described in a preferred embodiment. Because constraints are applied to such gain, it is this alternative representation of the dynamics profile or transfer function (namely, the FIG. 3b representation) that is utilized for the remainder of this example.

Averaging Constraints

Typically, the input signal level L in an audio dynamics processor is a time-varying measure of signal level using a relatively short time-constant—rms signal level integrated over a duration of a few milliseconds, for example. For the purposes of imposing constraints, a corresponding long-term, or average, signal level $\bar{L}$ may also be computed. $\bar{L}$ may be the same basic measure (e.g., rms, peak, etc.) as L but with a significantly longer time constant—on the order of one or more seconds, for example.

Although the time constants for L and $\bar{L}$ are not critical, it will be appreciated that the time constant for $\bar{L}$ is longer than that for L. In the case of dynamic range control (DRC), the short-term time constant may be commensurate with the human temporal resolution of loudness perception (the shortest time interval over which a person can perceive loudness variations), and the long-term may be commensurate with a time sufficient for a person to integrate "short-term" loudness into a psychoacoustic impression of the loudness of a sound source.

In a three-level control path hierarchy, such as the example of FIG. 2a, both a short-term and an average (long-term) signal level measure may be computed in the respective Dynamics Controls 16, 20 and 26 for the total of all audio channels combined, for each individual channel, and for each of a multiple of frequency bands in each channel. Such measures of signal level may be referred to as $L_T$ and $\bar{L}_T$, $L_C$ and $\bar{L}_C$, and $L_B$ and $\bar{L}_B$, respectively, and may represent logarithmic values, for example, as shown in FIGS. 3a and 3b.

With respect to a three hierarchical layer control path arrangement such as the example of FIG. 2a, the application of constraints may begin by specifying a desired dynamics processing profile, such as the one shown in FIG. 3b, for the Total hierarchy level. Such a profile may be represented generically as a function $F_T\{L\}$ relating gain G to signal level L at the Total hierarchical level. Thus $$G = F_T\{L\} \tag{1a}$$

Each signal level measure L, however measured (e.g., rms, peak, etc.), may be considered to have associated with it a notional gain G computed from the associated dynamics processing function $F_T$. Thus, gains $G_T$ and $\bar{G}_T$ may be computed from $L_T$ and $\bar{L}_T$ according to $$G_T = F_T\{L_T\} \tag{1b}$$

$$\bar{G}_T = F_T\{\bar{L}_T\} \tag{1c}$$

Next, for each channel at the Channels control path hierarchical level, a dynamics processing function $F_C\{L\}$ relating gain G to signal level L at the Channels hierarchical level may be derived from $F_T$ constrained so that $\bar{G}_C = \bar{G}_T$ (where $G_C$ and $\bar{G}_C$ are the notional gains associated with $L_C$ and $\bar{L}_C$, respectively). Deriving the dynamics function $F_C\{L\}$ with the desired constraints may be achieved by shifting the input argument of $F_T$ by the difference, if any, depending on signal conditions, between the average signal levels $\bar{L}_T$ and $\bar{L}_C$. (see FIG. 4b):

$$F_C\{L\} = F_T\{(\bar{L}_T - \bar{L}_C) + L\} \tag{2a}$$

Depending on signal conditions, the effect may be a shift of the function $F_T$ on the gain/level axes, preserving the shape of the desired dynamics processing profile but moving all thresholds horizontally by the amount $\bar{L}_C - \bar{L}_T$, such that the relationship between the average channel signal level $\bar{L}_C$ and the various thresholds associated with the channel function $F_C$ is the same as the relationship between the total signal level $\bar{L}_T$ and the thresholds associated with the total function $F_T$. Such shifting is shown in FIGS. 4a-c, described further below. Equation 2a indicates that that information defining $F_T$ and $\bar{L}_T$ is passed from the Total hierarchical level to the Channels hierarchical level.

From the derived channel dynamics processing function $F_C$, the gains $G_C$ and $\bar{G}_C$ may be computed as $$G_C = F_C\{L_C\} \tag{2b}$$

$$\bar{G}_C = F_C\{\bar{L}_C\} \tag{2c}$$

From the previous equations it can be seen that $$\bar{G}_C = F_C\{\bar{L}_C\} = F_T\{(\bar{L}_T - \bar{L}_C) + \bar{L}_C\} = F_T\{\bar{L}_T\} = \bar{G}_T \tag{2d}$$

In constructing the channel dynamics function $F_C$ from the total dynamics function $F_T$ such that $\bar{G}_C = \bar{G}_T$, the average value of $G_C$ over time is equal to the average value of $G_T$ over time. In others words, the modification to a channel is, on average, equal to the desired modification to the signal in total. However, on a short-term basis, $\bar{L}_T$ and $\bar{L}_C$ remain relatively constant, and $G_C$ acts as a function of the channel signal level $L_C$ to reduce or prevent cross-channel pumping.

As an example, consider again the multi-channel audio signal with music in all channels and then a brief segment of loud dialog introduced in the center channel. Before the introduction of the dialog, the average total signal level $\bar{L}_T$ lies in the null-band of the dynamics function $F_T$ along with the short-term total signal level $L_T$. As a result, the function calls for no modification. The same is true for the signal levels $\bar{L}_C$ and $L_C$ with respect to $F_C$ in all the channels. When the dialog is introduced, the short-term signal level $L_C$ in the center channel increases significantly above the compression threshold of $F_C$, resulting in attenuation. The behavior of the signal levels in the remaining channels stays the same, however, and no attenuation is applied. Thus, cross-channel pumping is reduced or prevented at the expense of a momentary alteration to the spatial image. However, if the loud dialog then continues, the average total signal level $\bar{L}_T$ slowly increases above the compression threshold. This in turn results in a slowly increasing attenuation applied to all channels due to the constraints used in the construction of the channel functions $F_C$. This proceeds until the average attenuation applied to all channels reaches the attenuation level of that applied to the continuing dialog in the center channel. Therefore, a hierarchical constraint arrangement in accordance with aspects of the invention may provide a balance between the reduction or prevention of cross-channel pumping and the preservation of the spatial image.

The same principles apply to the individual bands within a channel. The dynamics processing function $F_B$ for a particular band may be constructed from the function of the channel of which it is a part just as the channel function may be constructed from the total function. The function $F_B$ may be derived by shifting the input argument of $F_C$ by the difference, if any, depending on signal conditions, between the average signal levels $\overline{L}_C$ and $\overline{L}_B$ (see FIG. 4c):

$$F_B\{L\} = F_C\{(\overline{L}_C - \overline{L}_B) + L\} \qquad (3a)$$

Equation 3a indicates that information defining $F_C$ and $\overline{L}_C$ is passed from the Channels hierarchical level to the Channels hierarchical level.

The band gains are computed according to $$G_B = F_B\{L_B\} \qquad (3b)$$

$$\overline{G}_B = F_B\{\overline{L}_B\} \qquad (3c)$$

This construction constrains $\overline{G}_B = \overline{G}_C$, which is shown below:

$$\overline{G}_B = F_B\{\overline{L}_B\} = F_C\{(\overline{L}_C - \overline{L}_B) + \overline{L}_B\} = F_C\{\overline{L}_C\} = \overline{G}_C \qquad (3d)$$

Because $\overline{G}_B = \overline{G}_C$, the average value of the band gain $G_B$ over time is approximately equal to that of $G_C$, but on a short-term basis, the gain $G_B$ varies as a function of the band signal level $L_B$ to reduce or prevent cross-spectral pumping. FIGS. 4a-c depict the described process of constructing $F_C$ as a shifted version of $F_T$ and $F_B$ as a shifted version of $F_C$ such that $\overline{G}_B = \overline{G}_C = \overline{G}_B$. The Total hierarchical level to Channels hierarchical level shift is shown in FIG. 4b. The Channels hierarchical level to Bands hierarchical level shift is shown in FIG. 4c. FIGS. 4a-c may be viewed together to see how the desired dynamics processing profile is passed down the hierarchy from Total level to Channels level to Bands level.

Range Constraints

Ideally, the constraints used in the construction of $F_B$ from $F_C$ and $F_C$ from $F_T$ assure that the average modification applied to each band in a channel is substantially the same as that for the entire channel, and that the average modification applied to each channel is substantially the same as that for all channels combined. Because such constraints do not place limits on the range of the modifications around their average value, certain cases may be problematic. Consider again the multi-channel audio signal with music in all channels and then a brief segment of loud dialog introduced in the center channel. When the dialog is introduced, the total signal level $L_T$ increases a certain amount above the average total signal level $\overline{L}_T$, and the dynamics function $F_T$ calls for an overall attenuation of the signal. In the center channel, the signal level $L_C$ also increases above the average signal level $\overline{L}_C$, but the increase of $L_C$ relative to $\overline{L}_C$ is much larger than the increase of $L_T$ relative to $\overline{L}_T$ because $L_T$ has contributions from all the other channels containing music. As a result, the attenuation computed by $F_C$ is significantly greater than the desired overall attenuation, computed by $F_T$. To reduce such problems, it is therefore desirable to place constraints on the range of the modifications in addition to their average behavior.

Such range constraints might be implemented in a number of ways, but a simple and effective technique involves constraining the channel gain $G_C$ to lie between the total short-term and average gains $G_T$ and $\overline{G}_T$ and then to further constrain the band gain $G_B$ to lie between the channel short-term and average gains $G_C$ and $\overline{G}_C$. Thus, when range constraints are also employed the information passed from the Total hierarchical level to the Channels hierarchical level includes not only information defining $F_T$ and $\overline{L}_T$, but also information defining $G_T$ and $\overline{G}_T$, and the information passed from the Channels hierarchical level to the Bands hierarchical level includes not only information defining $F_C$ and $\overline{L}_C$ but also information defining $G_C$ and $\overline{G}_C$. Letting $G'_C$ and $G'_B$ represent these range-constrained channel and band gains, the constraints may be written formally according to the following logic:

I) Total to Channel Constraint:
  A) If $G_T \leq \overline{G}_T$ then
    i) If $G_C < G_T$ then $G'_C = G_T$
    ii) Else if $G_C > \overline{G}_T$ then $G'_C = \overline{G}_T$
    iii) Else $G'_C = G_C$
  B) Else if $G_T > \overline{G}_T$ then
    i) If $G_C > G_T$ then $G'_C = G_T$
    ii) Else if $G_C < \overline{G}_T$ then $G'_C = \overline{G}_T$
    iii) Else $G'_C = G_C$ II) Channel to Band Constraint:
  A) If $G'_C \leq \overline{G}_C$ then
    i) If $G_B < G'_C$ then $G'_B = G'_C$
    ii) Else if $G_B > \overline{G}_C$ then $G'_B = \overline{G}_C$
    iii) Else $G'_B = G_B$
  B) Else if $G'_C > \overline{G}_C$ then
    i) If $G_B > G'_C$ then $G'_B = G'_C$
    ii) Else if $G_B < \overline{G}_C$ then $G'_B = \overline{G}_C$
    iii) Else $G'_B = G_B$ FIGS. 5a and 5b depict two examples of range constraints passing from total to channel to band. In each case, the constraint region from a current level of the hierarchy is passed down to the next level. In the top row one notes that at the Channels hierarchical level, constraint I.A.i from the above logic is imposed. At the Bands hierarchical level, constraint II.A.ii is then imposed. In the bottom row, constraint I.A.iii is imposed at the Channels hierarchical level, and constraint II.A.i is imposed at the Bands hierarchical level.

"Bottom-Up Constraints

In the examples above, constraints have been imposed in a "top-down" manner passing from upper to lower hierarchical levels (total to channels to bands in the FIGS. 2a and 2b example). It may also be beneficial to implement a further aspect of the invention in which "bottom-up" secondary constraints are implemented along with top-down primary constraints.

In accordance with another aspect of the invention, FIG. 6 depicts a general overview, in the context of the example of FIG. 2a, of the application of hierarchical "bottom-up" constraints in addition to the top-down hierarchical constraints of FIG. 2a. In the course of applying top-down constraints in the FIG. 2a example, each of the Dynamics Controls produces one or more constrained parameters, represented by the single dashed lines in FIG. 6.

As with respect to the FIG. 2a example, the input signal applied to the FIG. 6 hierarchical control path may be derived from an audio signal applied to an audio dynamics processor of which the FIG. 6 control path is a part, or, alternatively, from the processed (output) audio of such an audio dynamics processor or from a combination of such input and output audio signals.

To begin the process of applying bottom-up constraints, the top-down parameters may first be analyzed in an analyzing device or process ("Analyze") 27 across all bands in all channels to generate a secondary Bands hierarchical constraint or constraints that may passed back to all Dynamics Controls at the Bands level and, optionally, upward in the hierarchy to all the channels. As explained further below, Analyze 27 may compute, for example, an average or a minimum of all its inputs. In FIG. 6, such one or more secondary band constraints is shown as the double-dashed line output from Analyze 27 at the Bands hierarchical level. Such one or more secondary band constraints are applied to and utilized by each Dynamics Control 26'-1-1 through 26'-c-n in the Bands hierarchical level to further constrain the top-down dynamics control parameters of FIG. 2a. Such doubly-constrained (i.e., downwardly=constrained and upward-constrained) one or more dynamics control parameters are represented by the double dashed lines at the output of each band Dynamics Control 26'-1-1 through 26'-c-n. In other words, the doubly-constrained dynamics control parameters produced by each of the Dynamics Controls 26'-1-1 through 26'-c-n, shown in double dashed lines, are the result of the top-down constrained modification parameters produced by Dynamics Controls 26-1-1 through 26 of FIG. 2a as further constrained by the one or more bottom-up secondary constraints from the output of Analyze 27.

Optionally, the secondary constraints from the output of Analyze 27 are also passed upward in the hierarchy to the Channels hierarchical level. In that case, at the Channels hierarchical level, the top-down constrained dynamics control parameters across all channels, represented by the single dashed lines, are analyzed by an analyzer device or function ("Analyze") 21 along with the one or more secondary band constraints received from Analyze 27 to generate doubly-constrained modification parameters, represented by the double-dashed line output of Analyze 21 at the Channels hierarchical level. Such a secondary Channels hierarchical level constraint is utilized by each Dynamics Control 20-1 through 20-c in the Channel hierarchical level to produce one or more doubly-constrained dynamics control parameters, represented by the double-dashed lines at the output of each Dynamics Controls 20' at the Channels hierarchical level.

Optionally, the secondary constraints from the output of Analyze 21 are also passed upward in the hierarchy to the Total hierarchical level. In that case, the top-down constrained dynamics parameters for the Total hierarchical level are analyzed by an analyzing device or process ("Analyze") 17 along with the secondary channel constraints to generate a secondary total constraint, which in turn is used to create one or more doubly-constrained dynamics control parameters at the Total hierarchical level.

After applying such secondary, bottom-up constraints, doubly-constrained modification parameters at the output of ones of the Dynamics Control may be used to modify the audio. For example, the parameters at the outputs of the Dynamics Controls 26'-1-1 through 26"-c-n at the Bands hierarchical level may be used to modify individual bands within each channel of the audio signal. Alternatively, the parameters at the Channels hierarchical level may be used to modify each channel uniformly across bands, the parameters at the Total hierarchical level could be used to modify all channels uniformly, or some combination of parameters at various hierarchical levels, or functions thereof, may be used to modify the audio signal.

Such secondary bottom-up constraints are particularly useful when the dynamics processing system is in "release" mode, meaning that the short-term total signal level $L_T$ is less than the average total signal level $\overline{L}_T$. To understand the need for such constraints, consider once again the multi-channel audio signal with music in all channels and dialog in the center channel. Assume that the loud dialog has been constant in the center channel for a significant period of time. Therefore, the top-down constraints have converged to a steady state behavior, resulting in all channels receiving approximately the same amount of attenuation. Now assume that the dialog suddenly stops, leaving only the lower level music signal in all channels. The total signal level $L_T$ immediately drops below the average total signal level $\overline{L}_T$ into the null band of the dynamics function $F_T$, meaning that $G_T$ calls for no modification in comparison to the previous attenuation. The same is true of $G'_C$ in the center channel where dialog had been present. However, in the remaining channels, the behavior of $L_C$ with respect to $\overline{L}_C$ remains as it had been, meaning that the previous attenuation continues. Therefore, the center channel is now boosted with respect to the remaining channels, distorting the spatial image of the music. This distortion continues until the average total signal level $\overline{L}_T$ decreases to the average level of the music, lying in the null-band, at which time the top-down constraints result in no modification applied to the remaining channels. Therefore, the spatial image of the music is distorted for a significant period of time as $\overline{L}_T$ slowly decreases.

To address this problem, one may apply a secondary bottom-up constraint when $L_T < \overline{L}_T$. For the particular problem just described, one may analyze the values of $G'_C$ across all channels and constrain these values along with $G_T$ to all be equal to the minimum value of $G'_C$ across all channels. This prevents any one channel from being boosted more than any other. The same principle may be extended down to the bands. If $L_T < \overline{L}_T$, the values of $G'_B$ across all bands and channels may be constrained to be equal to the minimum of this set of values. This minimum is then passed back up to the channels where $G'_C$ for all channels is set equal to the minimum of the set including $G'_C$ across all channels along with the minimum from the band constraint. This channel minimum may finally be passed back up to the total where $G_T$ is set equal to the minimum of $G_T$ and the previous channel minimum.

Time Smoothing

The application of the described hierarchical constraints, both top-down and bottom-up, may introduce abrupt discontinuities in the trajectories of the gains over time. Left unmodified, such discontinuities may cause perceptible artifacts in the processed audio. Therefore, smoothing the constrained gains over time prior to their use in modifying the audio is desirable in a practical embodiment of the invention. Such smoothing may be performed in a variety of ways, and one such method will be discussed below in the description of a preferred embodiment.

BEST MODE FOR CARRYING OUT THE INVENTION

Said International Patent Application PCT/US 2005/038579 of Alan Jeffrey Seefeldt, published as WO 2006/047600 discloses, among other things, arrangements for both measuring and modifying the perceived loudness and/or perceived spectral balance of an audio signal through the use of a psychoacoustic model of loudness perception. The disclosure discusses the use of such arrangements for audio dynamics processing, citing several advantages for performing such processing in the perceptual loudness domain. However, the Seefeldt arrangements may be improved further by aspects the present invention. Thus, a preferred embodiment of the present invention is next described in the context of a psychoacoustic loudness model.

Figure 7:
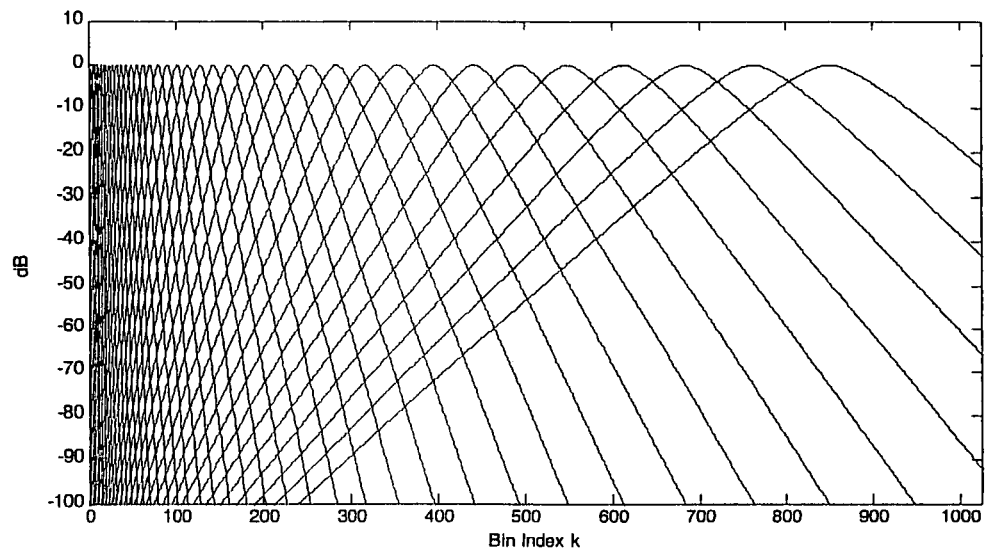
FIG. 7 depicts a suitable set of critical band filter responses in which 40 bands are spaced uniformly along the Equivalent Rectangular Bandwidth (ERB) scale, as defined by Moore and Glasberg.

As a first step, specific loudness, a measure of perceptual loudness distributed across frequency and time, of a multi-channel digital audio signal $x_c[n]$, c=1 . . . C, is computed through the following steps. First, an excitation signal $E_c[b,t]$ for each channel is computed approximating the distribution of energy along the basilar membrane of the inner ear at critical band b during time block t. This excitation may be computed from the Short-time Discrete Fourier Transform (STDFT) of the audio signal as follows:

$$E_c[b, t] = \lambda_b E_c[b, t-1] + (1 - \lambda_b) \sum_k |T[k]|^2 |C_b[k]|^2 |X_c[k, t]|^2 \quad (4)$$

where $X_c[k,t]$ represents the STDFT of $x_c[n]$ at time block t and bin k. T[k] represents the frequency response of a filter simulating the transmission of audio through the outer and middle ear, and $C_b[k]$ represents the frequency response of the basilar membrane at a location corresponding to critical band b. FIG. 7 depicts a suitable set of critical band filter responses in which 40 bands are spaced uniformly along the Equivalent Rectangular Bandwidth (ERB) scale, as defined by Moore and Glasberg (B. C. J. Moore, B. Glasberg, T. Baer, "A Model for the Prediction of Thresholds, Loudness, and Partial Loudness," Journal of the Audio Engineering Society, Vol. 45, No. 4, April 1997, pp. 224-240). Each filter shape is described by a rounded exponential function and the bands are distributed using a spacing of 1 ERB. The smoothing time constant $\lambda_b$ in Eqn. 4 may be advantageously chosen proportionate to the integration time of human loudness perception within band b.

In addition to the per channel excitation, an excitation representative of the total audio signal is computed by summing the channel excitations across channels:

$$E_T[b, t] = \sum_{c=1}^{C} E_c[b, t] \quad (5)$$

Figure 8:
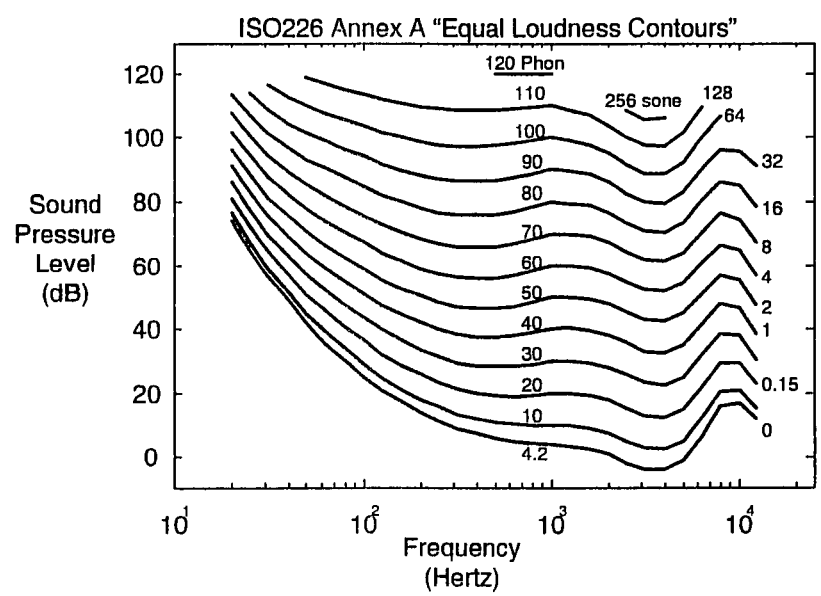
FIG. 8 is a set of equal-loudness contours.

Using equal-loudness contours, such as those depicted in FIG. 8, the total and channel excitations at each band are next transformed into excitation levels that would generate the same loudness at 1 kHz. Total and channel specific loudness spectra are finally computed from these transformed excitations, $E'_c[b,t]$ and $E'_T[b,t]$, through a compressive non-linearity. Referring generically to the function to compute specific loudness N from the transformed excitation E as N=D{E}, one such suitable function is given by:

$$\Phi\{E\} = \beta\left(\left(\frac{E}{TQ_{1kHz}}\right)^\alpha - 1\right) \quad (6)$$

where $TQ_{1kHz}$ is the threshold in quiet at 1 kHz and the constants β and α are chosen to match published growth of loudness data. Using this function, the total and channel specific loudness spectra are computed according to:

$$N_T[b,t] = \Psi\{E'_T[b,t]\} \quad (7a)$$

$$N_c[b,t] = \Psi\{E'_c[b,t]\} \quad (7b)$$

Total loudness and channel loudness values are then computed by summing the total and channel specific loudness spectra across bands b:

$$N_T[t] = \sum_b N_T[b, t] \quad (8a)$$

$$N_c[t] = \sum_b N_c[b, t] \quad (8b)$$

For the purposes of imposing dynamics processing constraints, average specific loudness spectra and average loudness values are computed by smoothing the specific loudness spectra and loudness values from above using a large smoothing time-constant $\bar{\lambda}$:

$$\bar{N}_T[t] = \bar{\lambda}\bar{N}_T[t-1] + (1-\bar{\lambda})N_T[t] \quad (9a)$$

$$\bar{N}_c[t] = \bar{\lambda}\bar{N}_c[t-1] + (1+\bar{\lambda})N_c[t] \quad (9b)$$

$$\bar{N}_c[b,t] = \bar{\lambda}\bar{N}_x[b,t-1] + (1-\bar{\lambda})N_c[b,t] \quad (9c)$$

Finally, values corresponding to the generic terms $L_T$, $\overline{L}_T$, $L_C$, $\overline{L}_C$, $L_B$, $\overline{L}_B$ used in the general description of the invention are computed from the loudness values and specific loudness spectra as:

$$L_T \rightarrow L_T[t] = \log(N_T[t]) \qquad (10a)$$

$$\overline{L}_T \rightarrow \overline{L}_T[t] = \log(\overline{N}_T[t]) \qquad (10b)$$

$$L_C \rightarrow L_c[t] = \log(N_c[t]) \qquad (10c)$$

$$\overline{L}_C \rightarrow \overline{L}_c[t] = \log(\overline{N}_c[t]) \qquad (10d)$$

$$L_B \rightarrow L_c[b,t] = \log(N_c[b,t]) \qquad (10e)$$

$$\overline{L}_B \rightarrow \overline{L}_c[b,t] = \log(\overline{N}_c[b,t]) \qquad (10f)$$

Starting with a desired total dynamics function $F_T$ that takes as its input log perceptual loudness and outputs the log of the desired perceptual loudness scaling, the top-down and bottom-up constraints detailed in the general description of the invention are applied to generate constrained total, channel, and band log loudness scaling values represented by $G'_T[t]$, $G'_c[t]$, and $G'_c[b,t]$, respectively.

The constrained band log loudness scaling $G'_c[b,t]$ is used to modify the audio signal. However, this quantity must first be smoothed over time to remove any temporal discontinuities introduced through the application of the constraints. The smoothing may advantageously employ a fast and slow time constant where the decision of which time constant to use is based on simultaneous smoothing of both $L_c[b,t]$ and $G'_c[b,t]$. If $L_c[b,t]$ is increasing relative to its smoothed version while $G'_c[b,t]$ is decreasing relative to its smoothed version, then the fast time constant is used. Otherwise, the slow time constant is used. More specifically, temporally smoothed versions of $L_c[b,t]$ and $G'_c[b,t]$ are computed as:

$$\tilde{G}'_c[b,t] = \tilde{\lambda}_c[b,t]\tilde{G}'_c[b,t] + (1 - \tilde{\lambda}_c[b,t])G'_c[b,t] \qquad (11a)$$

$$\tilde{L}_c[b,t] = \tilde{\lambda}_c[b,t]\tilde{L}_c[b,t] + (1 - \tilde{\lambda}_c[b,t])L_c[b,t] \qquad (11b)$$

where $$\tilde{\lambda}_c[b,t] = \begin{cases} \lambda_{fast}, & G'_c[b,t] < \tilde{G}'_c[b,t-1] \text{ and} \\ & L_c[b,t] > \tilde{L}_c[b,t-1] \\ \lambda_{slow}, & \text{otherwise} \end{cases} \qquad (11c)$$

As a next step in computing the modified signal, a desired modified specific loudness spectrum in each channel is computed by multiplying the original specific loudness with the smoothed band scaling $\tilde{G}'_c[b,t]$:

$$\hat{N}_c[b,t] = \exp(\tilde{G}'_c[b,t])N[b,t] \qquad (12)$$

Letting the function $\Psi\{\bullet\}$ represent the transformation from excitation to specific loudness, a band varying gain $g_c[b,m]$ is computed for each channel such that $$\hat{N}_c[b,t] = \Psi\{g_c^2[b,m]E_c[b,m]\} \qquad (13a)$$

Rearranging (13a), one arrives at the solution $$g_c[b,m] = \sqrt{\frac{\Psi^{-1}\{\hat{N}_c[b,m]\}}{E_c[b,m]}} \qquad (13b)$$

In said International Patent Application PCT/US 2005/038579 of Alan Jeffrey Seefeldt, published as WO 2006/047600, several techniques for computing the inverse function $\Psi^{-1}$ in (13b) are described, including a closed form expression, a lookup table, and iterative search.

Finally, the band varying gain $g_c[b,m]$ is applied in each critical band to the corresponding bins of the original STDFT to generate a modified STDFT:

$$\hat{X}_c[k,m] = \sum_b g_c[b,m]|C_b[k]|X_c[k,m] \qquad (14)$$

The modified STDFT is inverse transformed and overlap added to produce the final modified multichannel digital audio signal $\hat{x}_c[n]$. Further details of a digital audio processing arrangement employing overlapping blocks of samples are set forth in U.S. Pat. No. 5,899,969 of Fielder et al ("Frame-based audio with gain-control words"), which patent is hereby incorporated by reference in its entirety.

Figure 1:
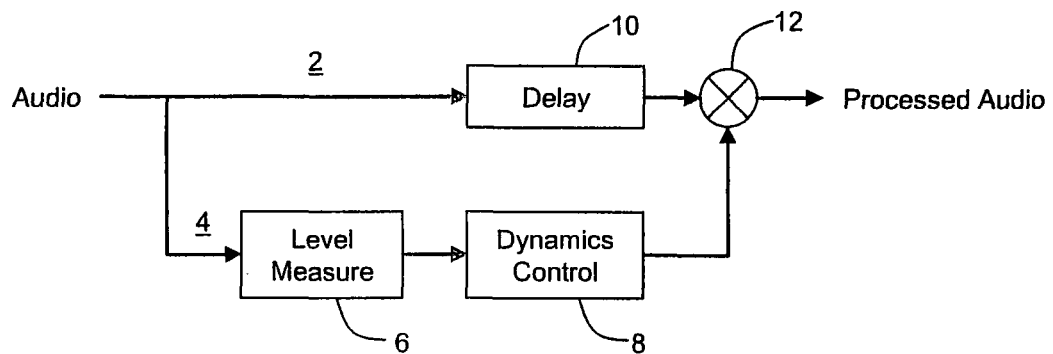
FIG. 1 is a high-level block diagram of a generic prior art audio dynamics processor that processes a single channel of a multichannel audio signal or an audio signal having only one channel.
Figure 2B:
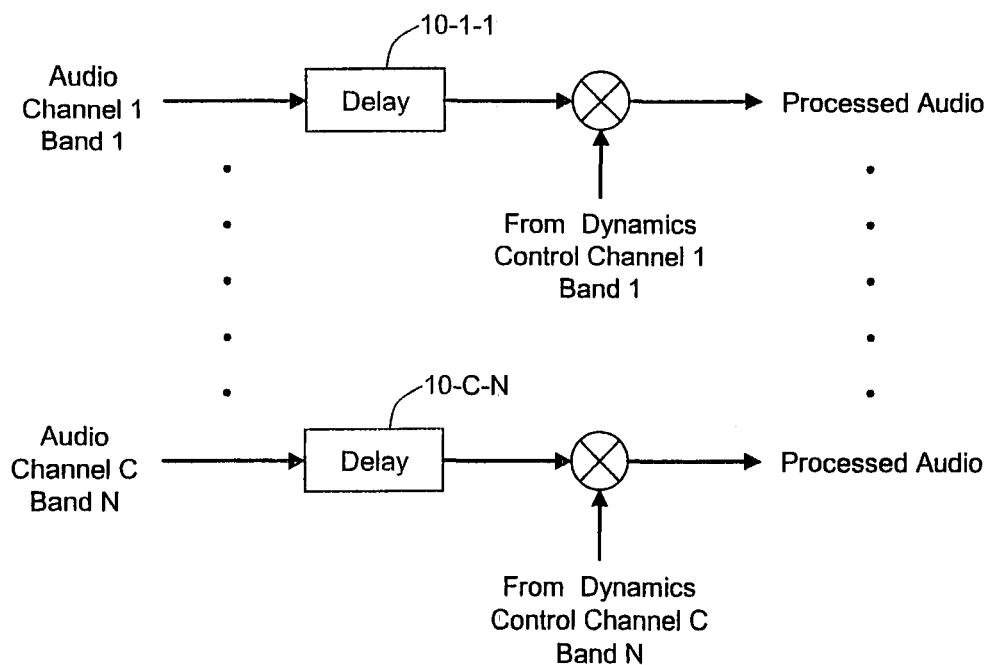
FIG. 2b is a schematic overview of an example of the audio path in which an audio signal may be modified in accordance with information derived in a control path such as that of FIG. 2a and/or that of FIG. 2a and FIG. 6.
Figure 2A:
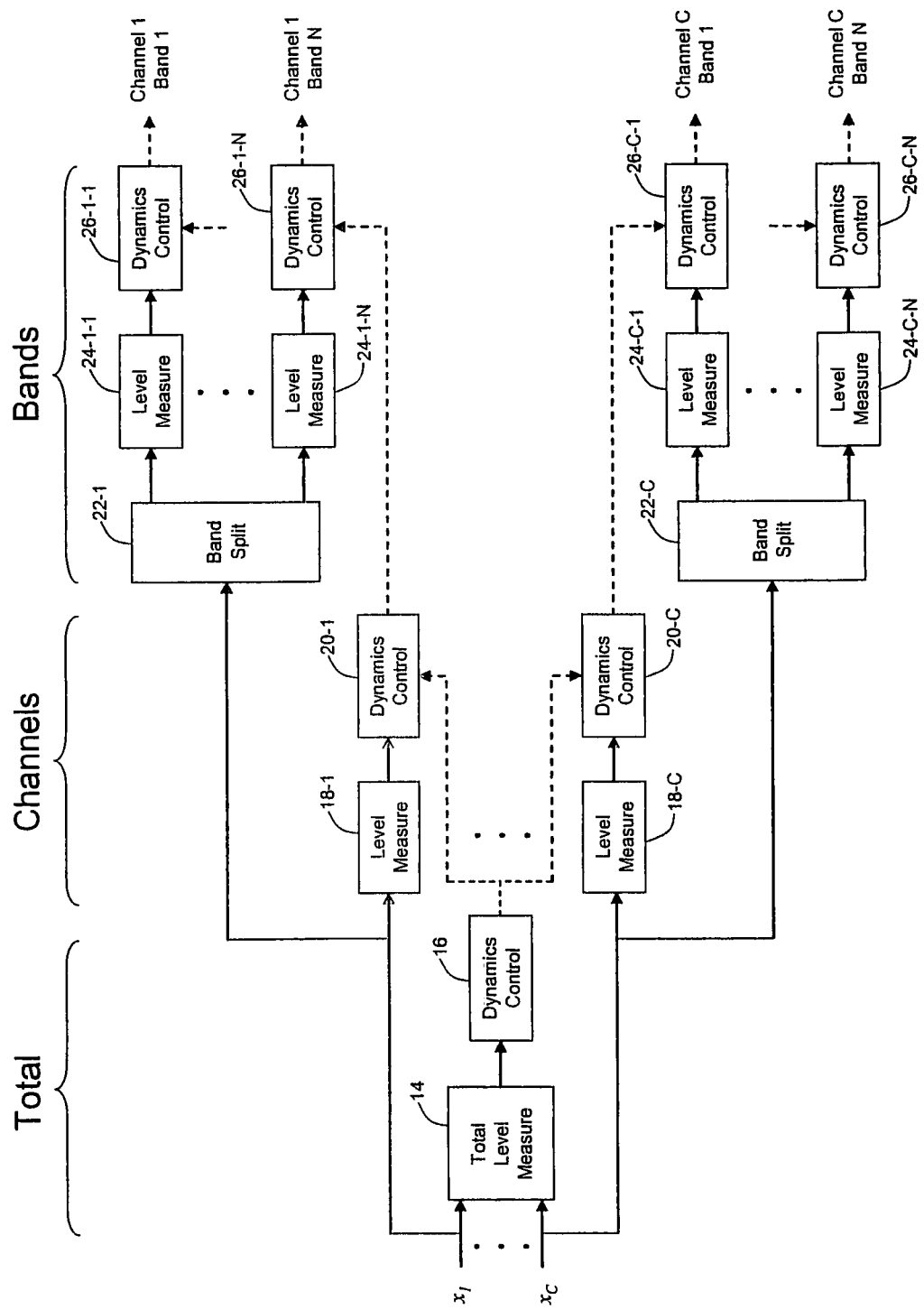
FIG. 2a is a schematic overview of an example of hierarchical control path architecture according to aspects of the invention in which information is passed down a control path hierarchy from top to bottom (a "top-down" hierarchical arrangement).
Figure 3A:
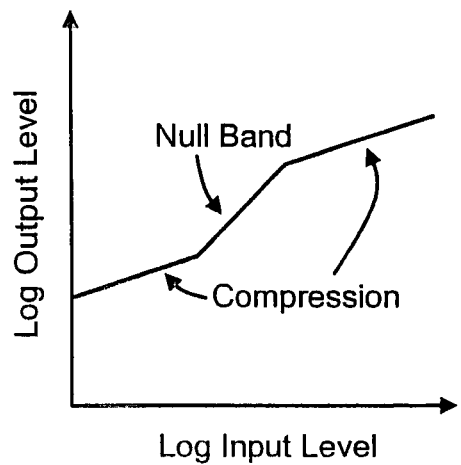
FIG. 3a is an exemplary input/output profile or transfer function for a dynamic range control (DRC) in which the horizontal axis is a logarithmic representation of the input signal level, and the vertical axis is a logarithmic representation of the desired output signal level.
Figure 3B:
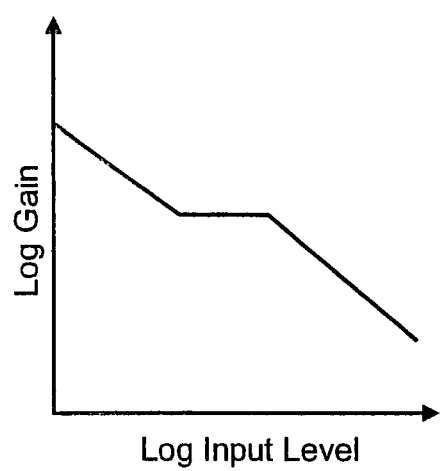
FIG. 3b is an equivalent representation of the FIG. 3a input/output profile or transfer function that replaces the output signal level on the vertical axis with the log of the gain, which when applied to the input signal level, results in the desired output signal level.
Figure 4A:
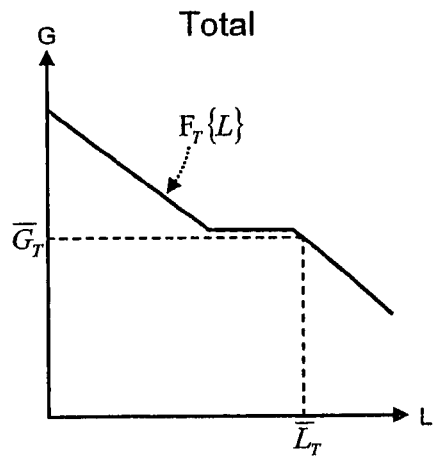
FIGS. 4a-c are examples, useful in understanding aspects of the invention, showing input/output profiles or transfer functions in the manner of FIG. 3b wherein versions of an initial profile at an initial upper hierarchical level is reconstructed at lower hierarchical levels, taking certain averaging constraints into account.
Figure 4B:
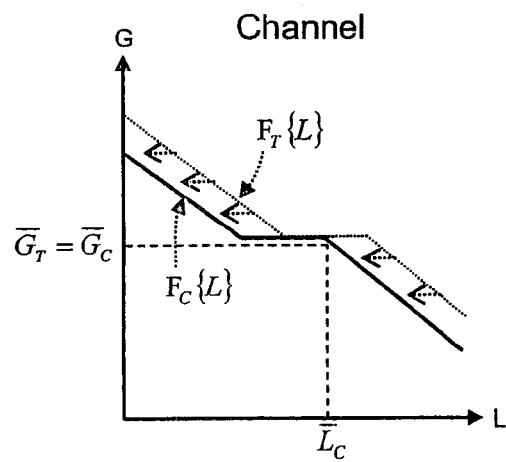
Figure 4C:
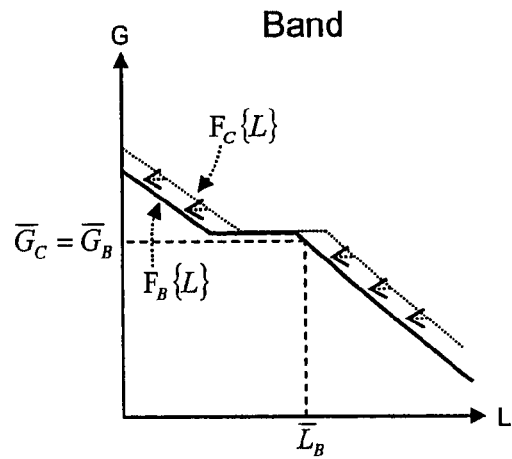
Figure 5A:
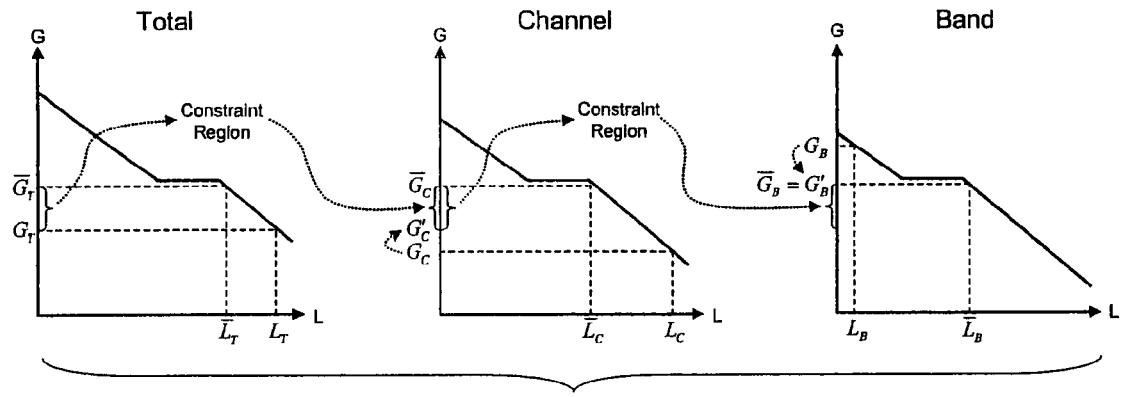
FIGS. 5a and 5b are examples, useful in understanding aspects of the invention, showing input/output profiles or transfer functions in the manner of FIG. 3b wherein versions of an initial profile at an initial upper hierarchical level is reconstructed at lower hierarchical levels, taking certain range constraints into account.
Figure 5B:
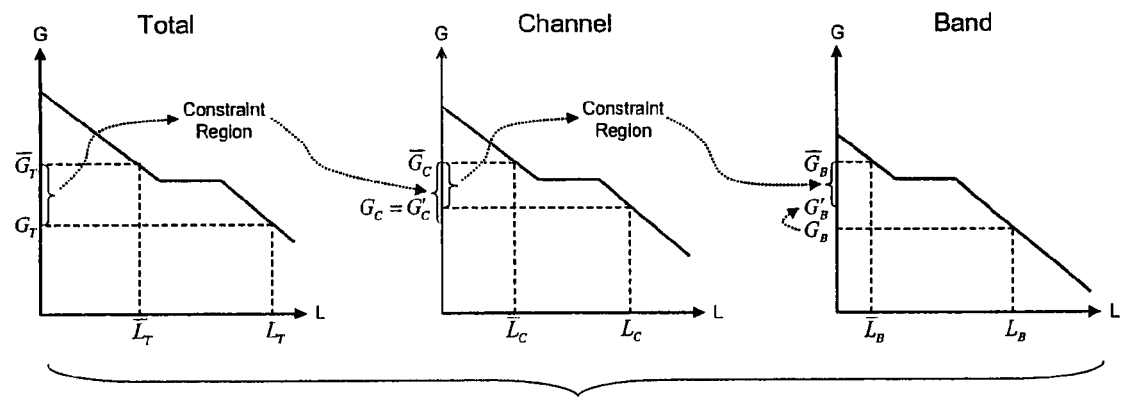
Figure 6:
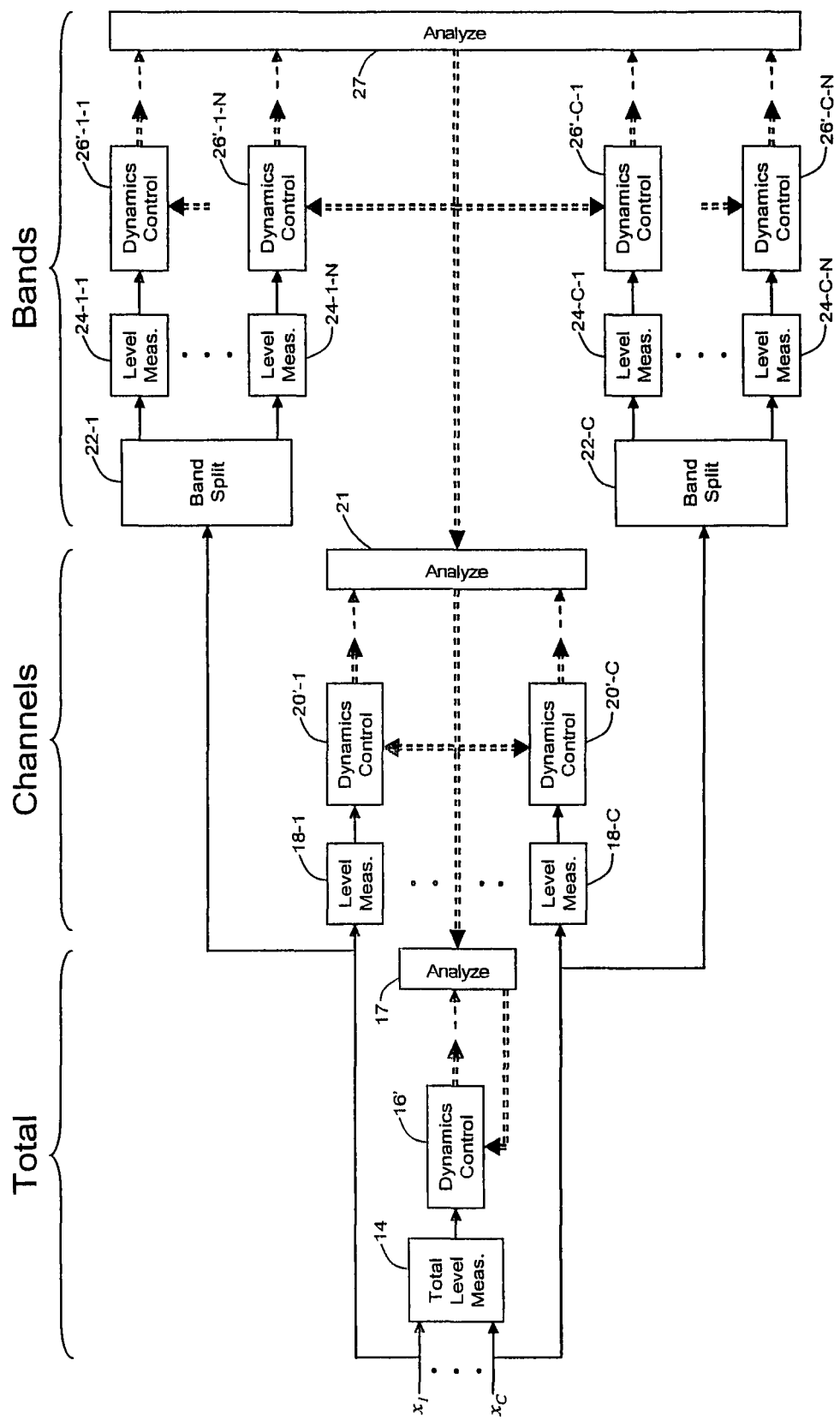
FIG. 6 is a schematic overview of an example of hierarchical control path architecture according to additional aspects of the invention in which information is passed up a control path hierarchy from bottom to top (a "bottom-up" hierarchical arrangement) in addition to the top-down hierarchical information of the FIG. 2a example.

Although various hierarchical constraints (e.g., $\overline{G}_B = \overline{G}_C$, $\overline{G}_B$) are expressed herein as equalities, such equalities are idealized examples. The invention contemplates the imposition of constraints that tend to bring such values closer to being equal than they otherwise would be in the absence of such an imposition of constraints. Similarly, although the passing of dynamics processing profiles from one hierarchical level to another are illustrated (e.g., FIG. 3b) as the passing of the same profile shape, such a sameness of shapes are idealized examples. The invention contemplates the passing of dynamics processing profiles from one hierarchical level to another in which the passed profile is an approximation of one or more higher level profiles, the degree of closeness being an implementation choice of the creator of the dynamics processing device or process.

Implementation

The invention may be implemented in hardware or software, or a combination of both (e.g., programmable logic arrays). Unless otherwise specified, the algorithms included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described herein may be order independent, and thus can be performed in an order different from that described.

The invention claimed is:

1. A method for generating audio signal dynamics control signals using a hierarchical control path architecture, comprising
receiving a plurality of audio channels,
in a first hierarchical level having a root node,
at said root node, computing a signal level for the total of all audio channels combined, and
at said root node, computing, in response to said signal level for the total of all audio channels combined, one or more first dynamics control parameters, and
in a second hierarchical level having a plurality of channels, each channel having one or more nodes,
at the node or nodes for each channel, computing a signal level for the particular audio channel, and
at the node or nodes for each channel, computing, in response to said signal level for the particular audio channel and to one or more of said first dynamics control parameters, one or more second dynamics control parameters.

2. The method of claim 1 wherein said one or more first dynamics control parameters includes control parameters for influencing the operation of said computing one or more second dynamics control parameters and/or modification parameters for directly or indirectly controlling the dynamics of an audio signal.

3. The method of claim 1 further comprising,
in a third hierarchical level,
splitting each audio channel into a plurality of frequency bands b1 through bn, each frequency band having one or more nodes,
at the node or nodes for each band, computing a signal level for the particular audio band, and
at the node or nodes for each band, computing in response to said signal level for the particular audio band and to one or more of said second dynamics control parameters, one or more third dynamics control parameters.

4. The method of claim 3 wherein said one or more second dynamics control parameters includes control parameters for influencing the operation of said computing one or more third dynamics control parameters and/or modification parameters for directly or indirectly controlling the dynamics of an audio signal.

5. Apparatus adapted to perform the methods of any one of claims 1 through 4.

6. A computer program, stored on a non-transitory computer-readable medium for causing a computer to perform the methods of any one of claims 1 through 4.

* * * * *